(12) United States Patent
Tsuchida et al.

(10) Patent No.: US 10,777,346 B2
(45) Date of Patent: Sep. 15, 2020

(54) CIRCUIT ASSEMBLY

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

(72) Inventors: Toshiyuki Tsuchida, Mie (JP); Shigeki Yamane, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/615,842

(22) PCT Filed: May 9, 2018

(86) PCT No.: PCT/JP2018/017879
§ 371 (c)(1),
(2) Date: Nov. 22, 2019

(87) PCT Pub. No.: WO2018/216465
PCT Pub. Date: Nov. 29, 2018

(65) Prior Publication Data
US 2020/0194160 A1    Jun. 18, 2020

(30) Foreign Application Priority Data

May 24, 2017 (JP) ................................. 2017-102465

(51) Int. Cl.
*H05K 1/18* (2006.01)
*H01F 27/06* (2006.01)
(Continued)

(52) U.S. Cl.
CPC ............ *H01F 27/06* (2013.01); *H01F 27/24* (2013.01); *H01F 27/2823* (2013.01);
(Continued)

(58) Field of Classification Search
CPC .... H05K 5/006; H05K 7/1417; H05K 7/1418; H05K 7/142; H05K 1/18; H05K 1/181;
(Continued)

(56) References Cited

FOREIGN PATENT DOCUMENTS

| JP | S52-019655 U | 2/1977 |
| JP | H07-094342 A | 4/1995 |

(Continued)

OTHER PUBLICATIONS

International Search Report, Application No. PCT/JP2018-017879, dated Aug. 7, 2018. ISA/Japan Patent Office.

*Primary Examiner* — Jeremy C Norris
(74) *Attorney, Agent, or Firm* — Honigman LLP

(57) ABSTRACT

A circuit assembly includes: a circuit board; an inductor that is disposed on the circuit board, and that includes a coil including a winding portion made by winding a winding wire, and a core member; and a heat dissipation plate that is disposed on the opposite side of the surface of the circuit board on which the inductor is disposed, wherein a through hole is provided in a region of the circuit board that corresponds to the inductor, and a receiving protrusion that penetrates the through hole and protrudes to a surface side of the circuit board on which the inductor is disposed, and that is in heat transfer contact with the coil and the core member is provided in a region that corresponds to the through hole in the heat dissipation plate.

6 Claims, 18 Drawing Sheets

(51) Int. Cl.
*H01F 27/24* (2006.01)
*H01F 27/28* (2006.01)
*H05K 1/11* (2006.01)
*H05K 1/02* (2006.01)

(52) U.S. Cl.
CPC .......... *H05K 1/0203* (2013.01); *H05K 1/115* (2013.01); *H05K 1/181* (2013.01); *H01F 2027/065* (2013.01); *H05K 2201/066* (2013.01); *H05K 2201/1003* (2013.01)

(58) Field of Classification Search
CPC ........ H05K 1/182; H05K 1/183; H05K 1/184; H05K 1/185; H05K 1/186; H05K 1/187; H05K 1/188; H05K 1/189
See application file for complete search history.

(56) References Cited

FOREIGN PATENT DOCUMENTS

| JP | H10-199731 A | 7/1998 |
| JP | 2013-149943 A | 8/2013 |
| JP | 2016-152349 A | 8/2016 |

# CIRCUIT ASSEMBLY

CROSS-REFERENCE TO RELATED APPLICATIONS

This application is the U.S. national stage of PCT/JP2018/017879 filed on May 9, 2018, which claims priority of Japanese Patent Application No. JP 2017-102465 filed on May 24, 2017, the contents of which are incorporated herein.

TECHNICAL FIELD

The technique disclosed in this specification relates to a circuit assembly.

BACKGROUND

A circuit assembly in which a circuit board and a heat dissipation plate that dissipates the heat generated in the circuit board to the outside overlap each other is known.

In such a circuit assembly, if a metal bus bar is disposed on the back side of the circuit board (the surface on which the heat dissipation plate is placed), the heat generated from the electronic components mounted on the circuit board is relatively efficiently transferred to the heat dissipation plate via the bus bar, which has high heat conductivity, and is dissipated to the outside. However, if no bus bar is disposed, the heat generated from the electronic components is difficult to be transferred to the heat dissipation plate, and thus the temperature of the circuit assembly and the inside of the apparatus accommodating the circuit assembly may become high.

Also, like the conventional coil described in JP H7-94342A, if a base made of synthetic resin is provided between a circuit board and a core, heat conductivity to a heat dissipation plate may further decrease, the temperature inside the case of the apparatus may become high, and the performance of electronic components may deteriorate.

The technique disclosed in the present specification has been completed based on the above-mentioned circumstances, and an object is to provide a circuit assembly having excellent heat dissipation.

SUMMARY

The technique disclosed in the present specification is a circuit assembly including: a circuit board; an inductor that is disposed on the circuit board, and that includes a coil including a winding portion made by winding a winding wire, and a core member; and a heat dissipation plate that is disposed on the opposite side of the surface of the circuit board on which the inductor is disposed, wherein a through hole is provided in a region of the circuit board that corresponds to the inductor, and a receiving protrusion that penetrates the through hole and protrudes to a surface side of the circuit board on which the inductor is disposed, and that is in heat transfer contact with the coil and the core member is provided in a region of the heat dissipation plate that corresponds to the through hole.

In this configuration, the receiving protrusion provided on the heat dissipation plate protrudes from the through hole of the circuit board. Accordingly, the receiving protrusion can be in heat transfer contact with the coil or the core member at a position close to the coil or the core member that is a heat generating member. As a result, the heat generated from the coil and the core member can be efficiently transferred to the heat dissipation plate, and can be dissipated to the outside.

The above circuit assembly may also have the following configurations.

The coil may be disposed so that the axis of the winding portion extends along the circuit board, and the receiving protrusion may be in a shape extending along a side surface that extends along the axis of the winding portion, and may be in heat transfer contact with the side surface.

In this way, according to the configuration in which the coil is disposed vertically with respect to the circuit board, the area required for the coil on the circuit board can be reduced, as compared with a so-called horizontal configuration in which the coil is disposed in a direction in which the axis of the winding portion intersects the circuit board. As a result, the circuit assembly can be made more compact.

In addition, because the receiving protrusion is shaped along the side surface that extends along the axial direction of the winding portion of the coil disposed vertically, even if the side surface is not flat, the entire facing surface can be disposed close to the side surface. Accordingly, the circuit assembly is excellent in heat dissipation.

In the vertically disposed coil, if the side surface of the winding portion is not flat, there is a concern about rattling due to vibration, compared to the horizontally disposed coil. However, the receiving protrusion that is shaped along the side surface of the winding portion can stably support at least a part of winding portion from the circuit board side. Therefore, rattling of the coil can be reduced.

A filler such as grease or a heat dissipation agent may also be provided between the receiving protrusion and the coil or the core member. Alternatively, a cushioning material such as a heat dissipation sheet may also be provided. With this configuration, even if there is a tolerance on the contact surface between the receiving protrusion and the coil or the core member, and there is a gap, the receiving protrusion and the coil or the core member can be reliably contacted in terms of heat transfer. As a result, a circuit assembly having a more excellent heat dissipation effect can be obtained.

Advantageous Effects

According to the technique disclosed in the present specification, a circuit assembly having excellent heat dissipation can be obtained.

DETAILED DESCRIPTION OF PREFERRED EMBODIMENTS

First Embodiment

The first embodiment will be described with reference to FIGS. 1 to 12. A circuit assembly 10 of the present embodiment is disposed between a power source such as a battery and on-board electrical components such as a lamp and a motor, and is accommodated in a case of an electrical junction box that performs connection and disconnection of power supplied from the power source to the on-board electrical components. In the following description, the upper side in FIG. 5 is described as the front side or the upper side, and the lower side is described as the back side or the lower side. Also, the lower side in FIG. 2 is described as the front, the right side as the right, and the left side as the left.

Figure 1:
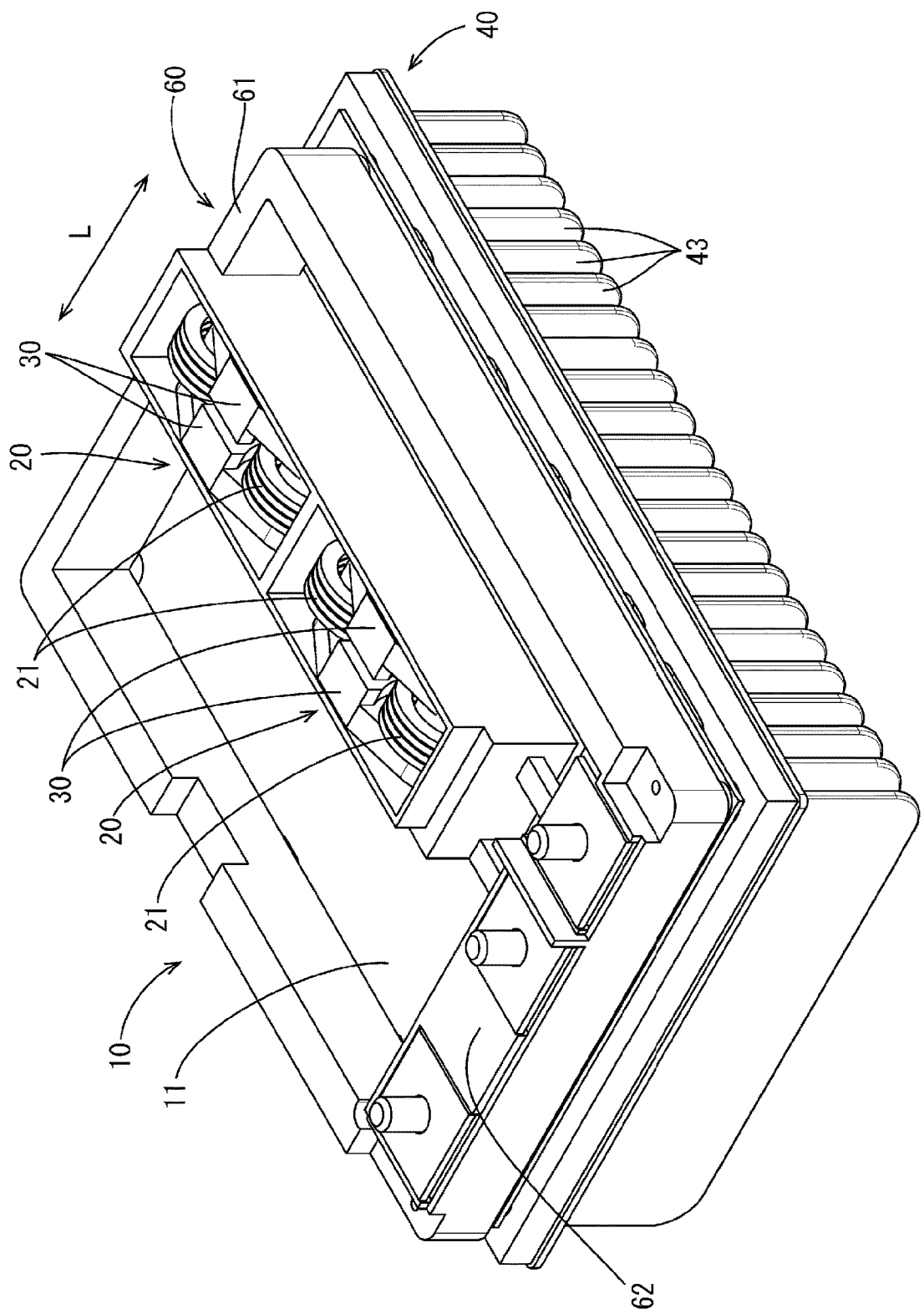
FIG. 1 is a perspective view of a circuit assembly according to a first embodiment.
Figure 2:
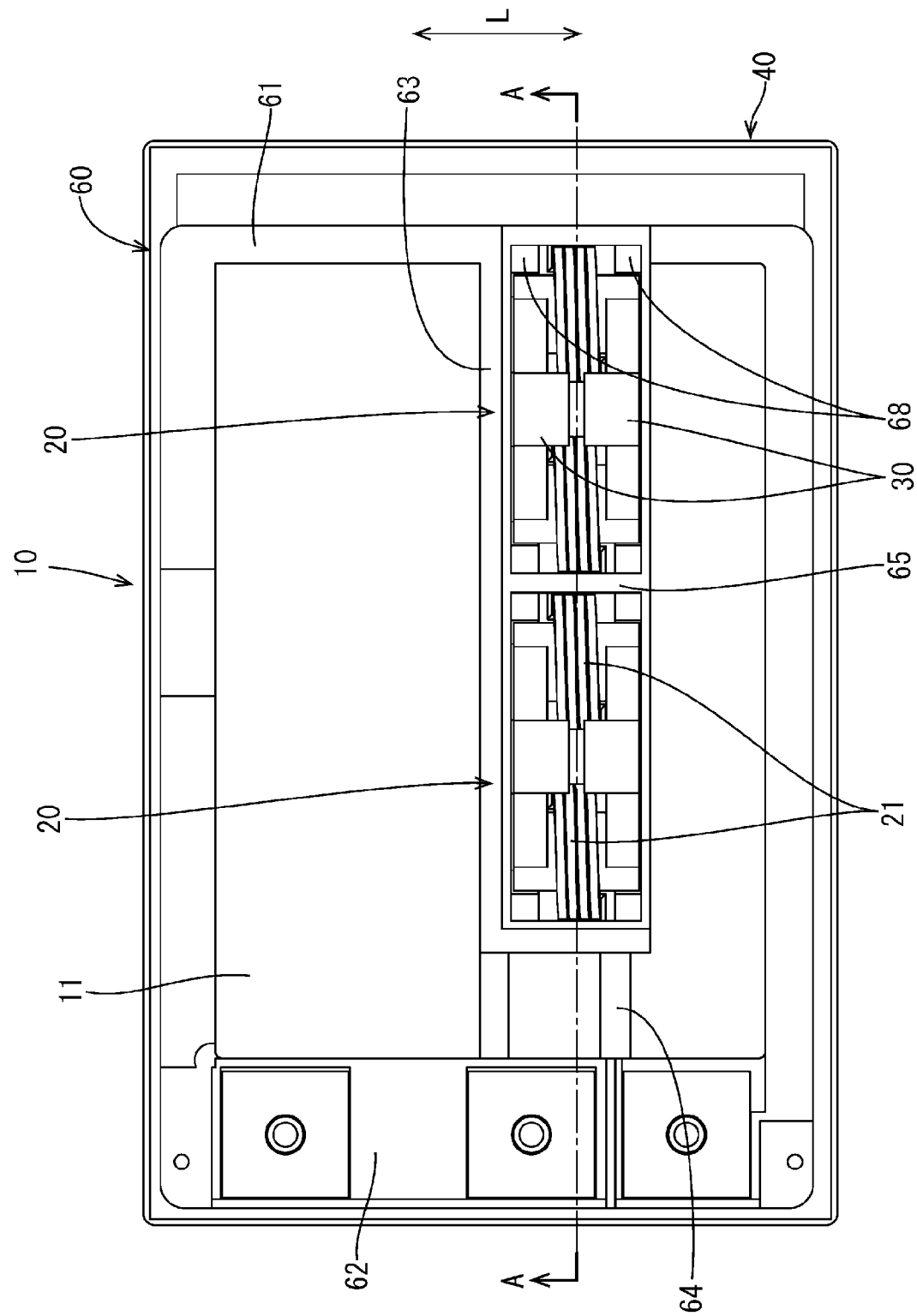
FIG. 2 is a plan view of the circuit assembly.

As shown in FIGS. 1 and 5, the circuit assembly 10 includes a circuit board 11, a heat sink 40 (an example of a heat dissipation plate) that is disposed on the back side (the lower surface in FIG. 5) of the circuit board 11, and a frame 60 that is positioned with respect to the circuit board 11.

Circuit Board 11

The circuit board 11 includes a conductive circuit (not shown) formed on an insulating substrate by a printed wiring technique, and inductors 20 and a plurality of other electronic components mounted at predetermined positions of the conductive circuit. The plurality of electronic components including the inductors 20 are disposed on one surface (front surface) of the circuit board 11. The circuit board 11 may also be a double-sided mounting type in which the electronic components are mounted on both sides.

The circuit board 11 has a substantially rectangular shape, and a plurality of connection through holes (not shown) are provided at predetermined positions. These connection through holes are used for connecting the electronic components to the conductive circuit, and the electronic components are connected to the conductive circuit in the connection through holes by a known method such as soldering.

In the present embodiment, of the plurality of electronic components, only the inductors 20 are shown, and other electronic components are not shown.

Inductor 20

Figure 5:
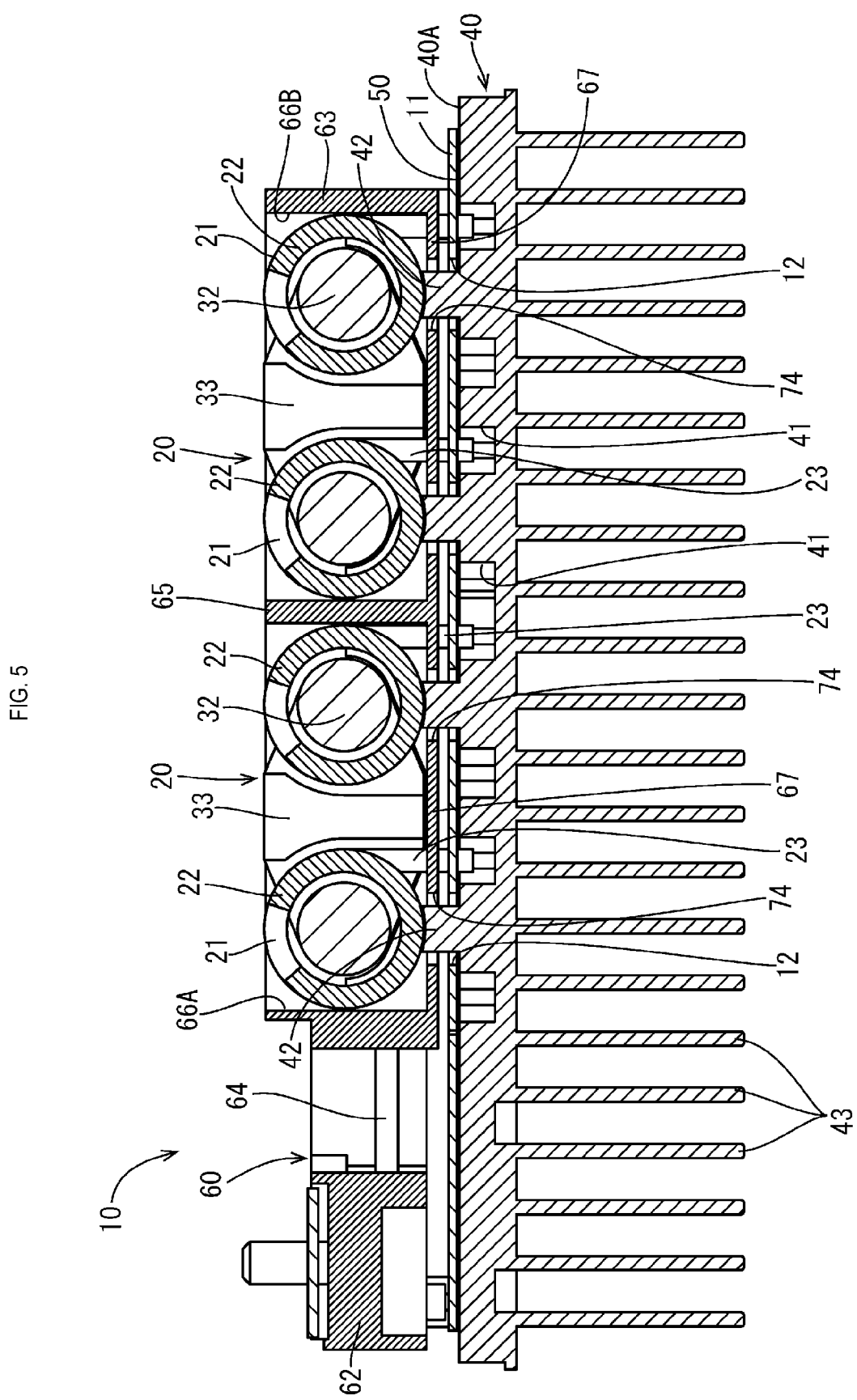
FIG. 5 is a cross sectional view taken along line A-A of FIG. 2.
Figure 6:
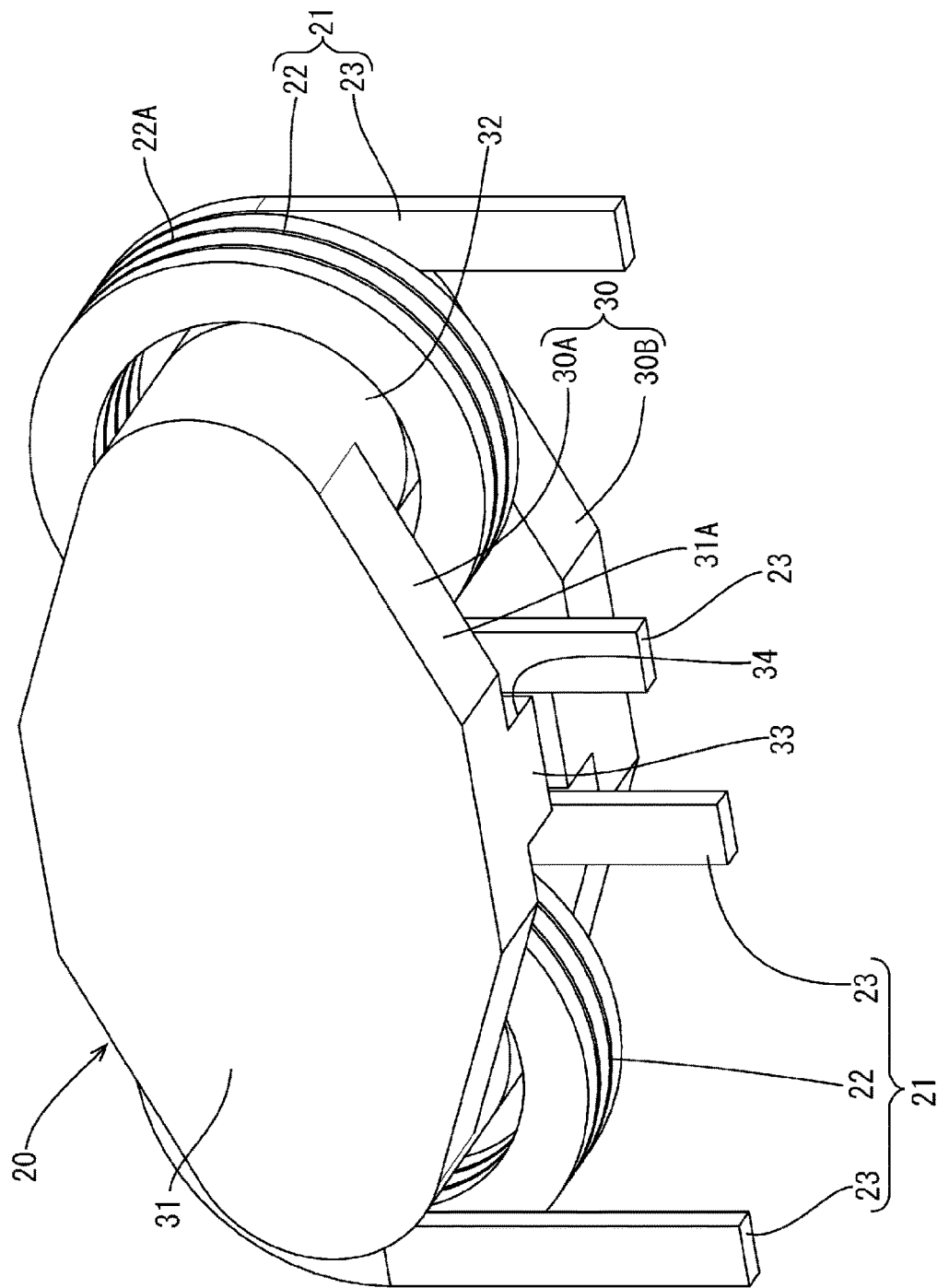
FIG. 6 is a perspective view of an inductor.

The inductors 20 used in the present embodiment have a coupled inductor structure, and include a pair of coils 21 each formed by winding a winding wire, and a magnetic core 30 (see FIGS. 5 and 6).

Coil 21

Each coil 21 is an edgewise coil 21 formed by winding a rectangular wire (an example of a winding wire) in an edgewise shape and in an annular shape. The coil 21 includes a winding portion 22 made by winding a winding wire to form a cylindrical shape as a whole, and a pair of lead terminals 23 that extends from both ends in the axial direction L of the winding portion in the same direction (downward) and in parallel to each other, and is connected to the conductive circuit.

Magnetic Core 30

The magnetic core 30 is formed by combining a pair of a first core 30A and second core 30B having the same shape and size. The first core 30A and the second core 30B each have a substantially oval thick plate-like bottom wall portion 31, and are arranged so that the bottom wall portions 31 face each other.

A pair of columnar side legs 32 extending toward the mating core is provided at both ends in the longitudinal direction of one bottom wall portion 31. Also, a plate-like central leg 33 is provided at the center of the bottom wall portion 31, and extends along the short side direction toward the mating core. As shown in FIG. 5, in the state where the winding portion 22 of the coil 21 is arranged around the side leg 32, the central leg 33 becomes thicker towards its end portion, so that it extends along (parallel to) the side surface 22A of the winding portion 22. In addition, the regions where the lead terminals 23 are arranged in the end portions of the central leg 33 are escape portions 34 that are cut out to make room for the lead terminals 23 (see FIG. 6).

The rising dimension (height) of the side leg 32 and the central leg 33 from the bottom wall portion 31 is set so that the side leg 32 is slightly longer. In this manner, in the state where the pair of first core 30A and second core 30B are combined, a gap is formed between the end surfaces of the central legs 33 facing each other.

The inductor 20 has a configuration in which a pair of coils 21 are arranged side by side so that the axes of the winding portions 22 are parallel and horizontal, and the coils 21 are held together by the magnetic core 30 (the first core 30A and the second core 30B).

In this assembled state, the winding portions 22 of the pair of coils 21 are disposed around the side legs 32 of the first core 30A and the second core 30B, respectively. Also, two pairs (four) of lead terminals 23 of the pair of coils 21 are extended in the same direction (downward in FIG. 6) while avoiding interference with the magnetic core 30 by the escape portions 34 of the magnetic core 30. The central leg 33 is disposed between the pair of coils 21 arranged side by side. In this state, the end surfaces of the pair of the central legs 33 facing each other are disposed apart from each other, and a gap is formed between them.

Note, that in this state, the coil 21 and the magnetic core 30 are not relatively positioned, and the winding portion 22 of the coil 21 is disposed to be freely movable around the side leg 32 of the magnetic core 30.

Heat Sink 40

The heat sink 40 is disposed on the lower surface of the circuit board 11. The heat sink 40 is a heat dissipation member made of a metal material having excellent heat conductivity such as aluminum or an aluminum alloy, and dissipates heat generated in the circuit board 11.

An upper surface 40A of the heat sink 40 has a substantially flat plate shape, and the circuit board 11 is disposed at a predetermined position thereon via an insulating sheet 50. The insulating sheet 50 has an adhesive property that can be fixed to the circuit board 11 and the heat sink 40.

Figure 7:
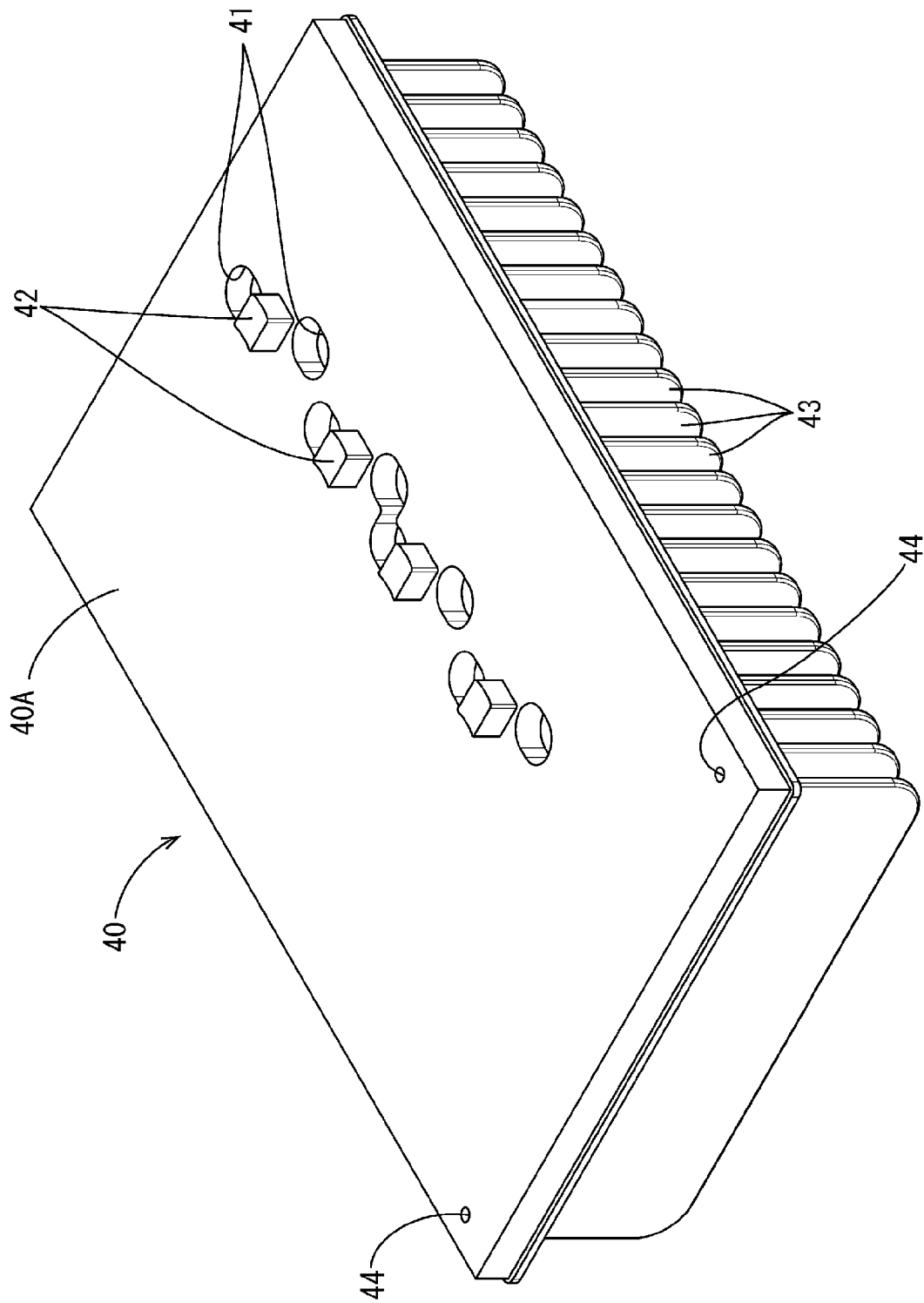
FIG. 7 is a perspective view of a heat sink.
Figure 8:
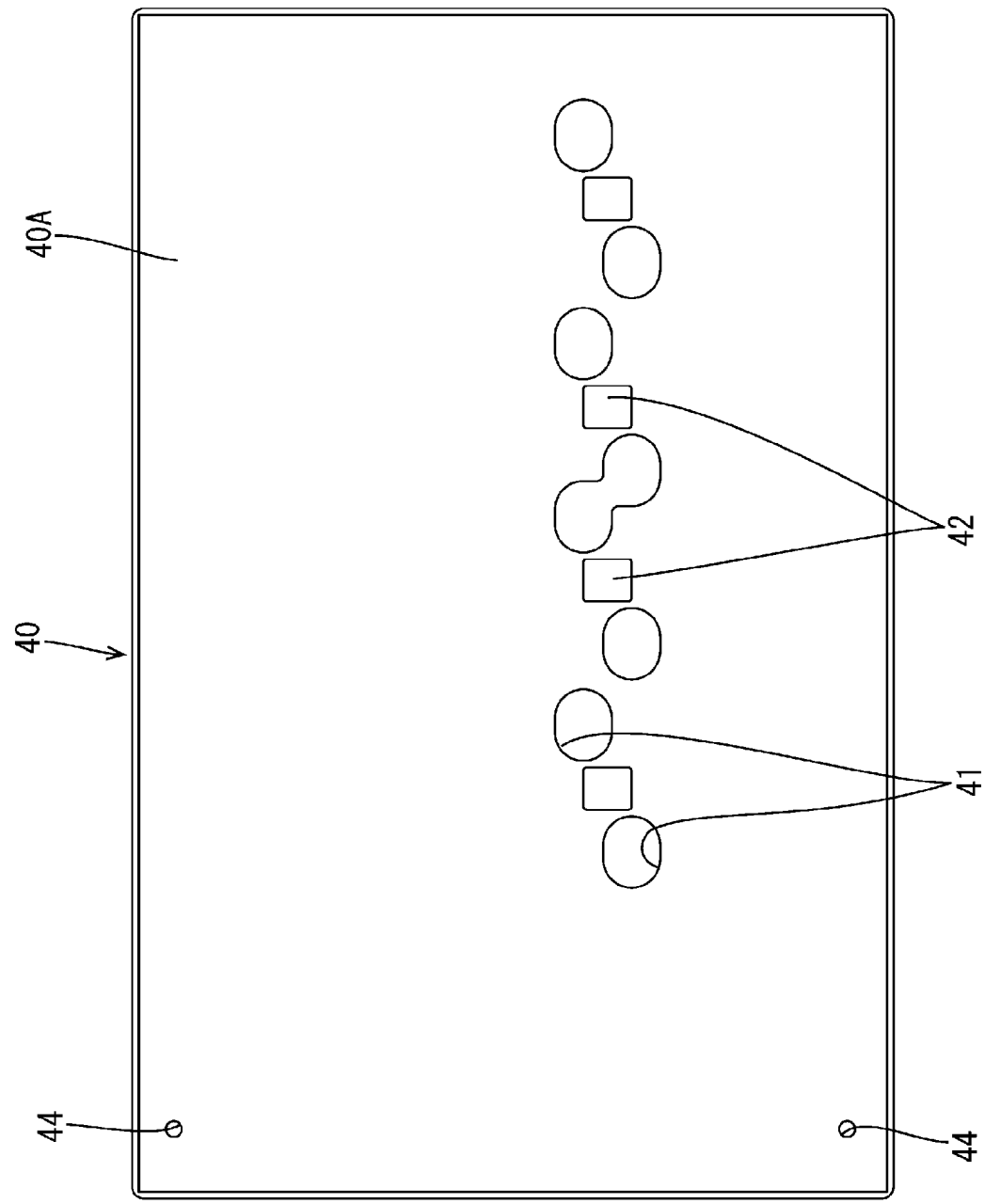
FIG. 8 is a plan view of the heat sink.

As shown in FIGS. 5 and 7, escape recesses 41 that are recessed downward from the upper surface 40A and can accommodate the lead terminals 23 of the coils 21 are provided in a region of the upper surface 40A of the heat sink 40, in which the above inductors 20 are disposed.

Figure 9:
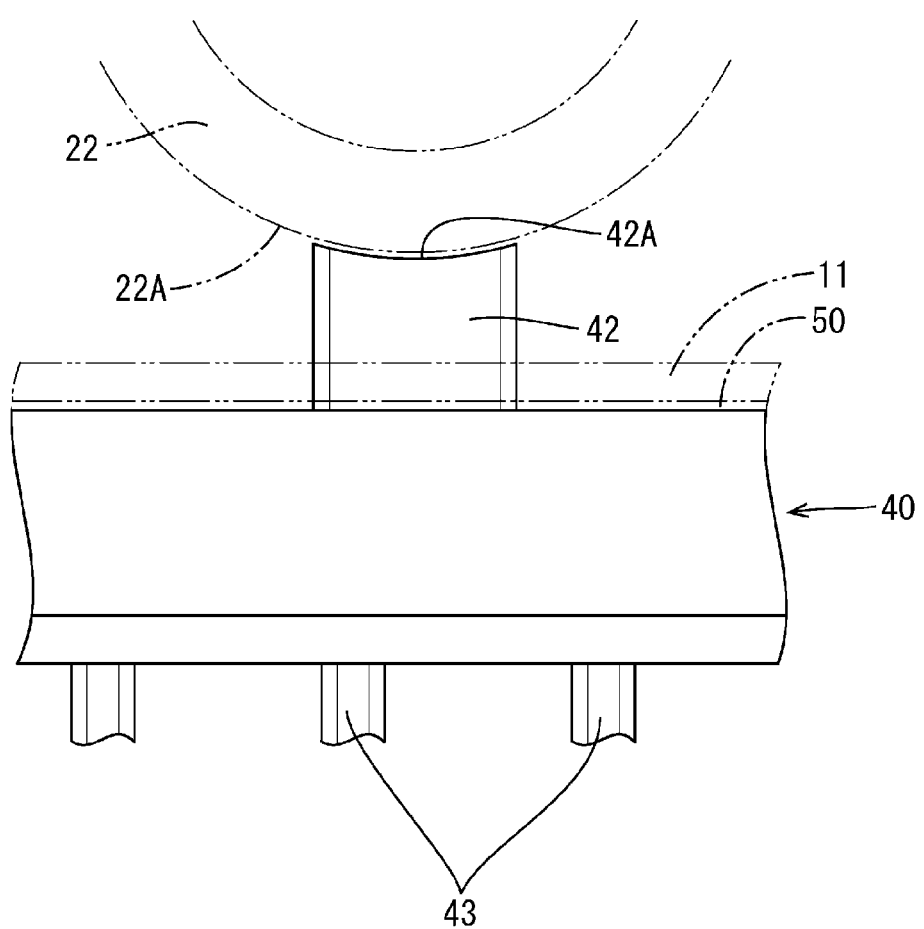
FIG. 9 is a partially enlarged side view of the heat sink.

Also, in the upper surface 40A of the heat sink 40, receiving protrusions 42 that protrude upward from the upper surface 40A and that are in heat transfer contact with the winding portions 22 are provided in regions where the winding portions of the coils 21 are disposed. Each receiving protrusion 42 has a substantially quadrangular prism shape, and its upper surface 42A (the surface facing the winding portion 22) is curved along a side surface 22A that extends along the axis of the winding portion 22, as shown in FIG. 9.

The protruding dimension of the receiving protrusion 42 from the upper surface 40A of the heat sink 40 is set to be larger than the thickness of the circuit board 11. With this configuration, in the state where the circuit board 11 is disposed at the predetermined position of the upper surface 40A of the heat sink 40, the receiving protrusions 42 penetrate the board side through holes 12 in the circuit board 11 and protrude upward from the upper surface of the circuit board 11, approaching the winding portions of the coils 21. Note, that if the circuit board is a double-sided mounting type, the receiving protrusion protrudes further upward by an amount corresponding to the dimensions of the electronic components mounted on the back surface of the circuit board.

Furthermore, in the present embodiment, in the state where a frame 60 described later is positioned with respect to the circuit board 11, the protrusion dimension of the receiving protrusion 42 is set to such a dimension that it penetrates a bottom wall 67 of a subframe 63 described later and protrudes upward from the bottom wall 67, and that it can contact the side surface 22A of the winding portion 22.

Note, that escape holes (not shown) are provided through the insulating sheet 50 at positions corresponding to the escape recesses 41 and the receiving protrusions 42.

In addition, a large number of plate-like fins 43 extending downward are provided on the lower surface of the heat sink 40.

Frame 60

Figure 10:
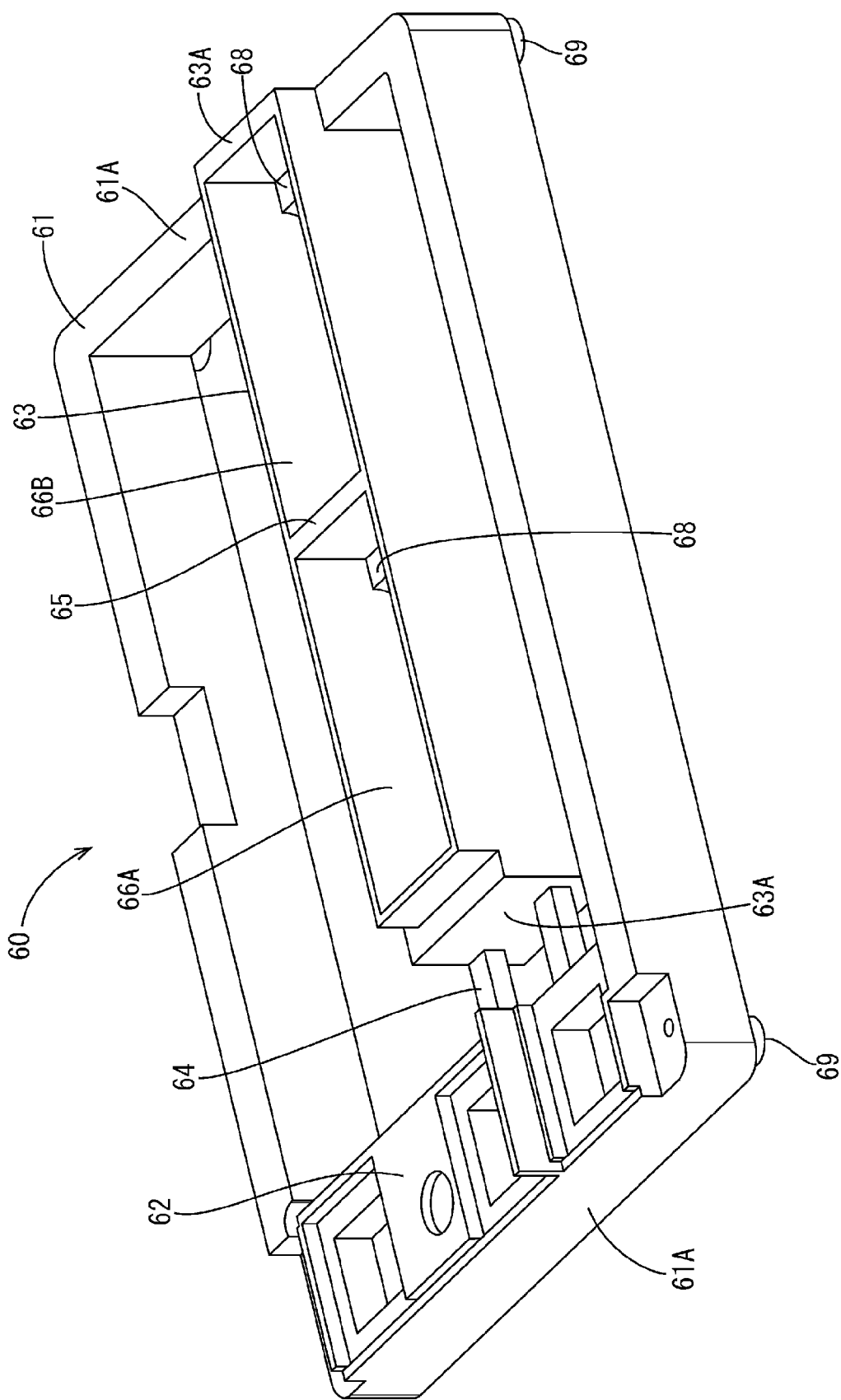
FIG. 10 is a perspective view of a frame.
Figure 12:
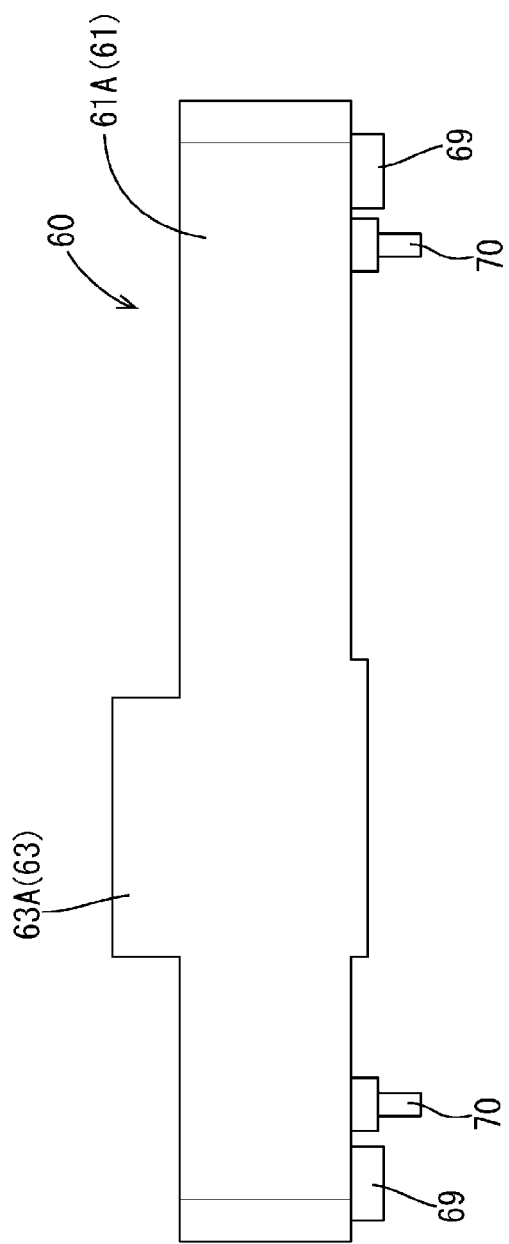
FIG. 12 is a right side view of the frame.
Figure 13:
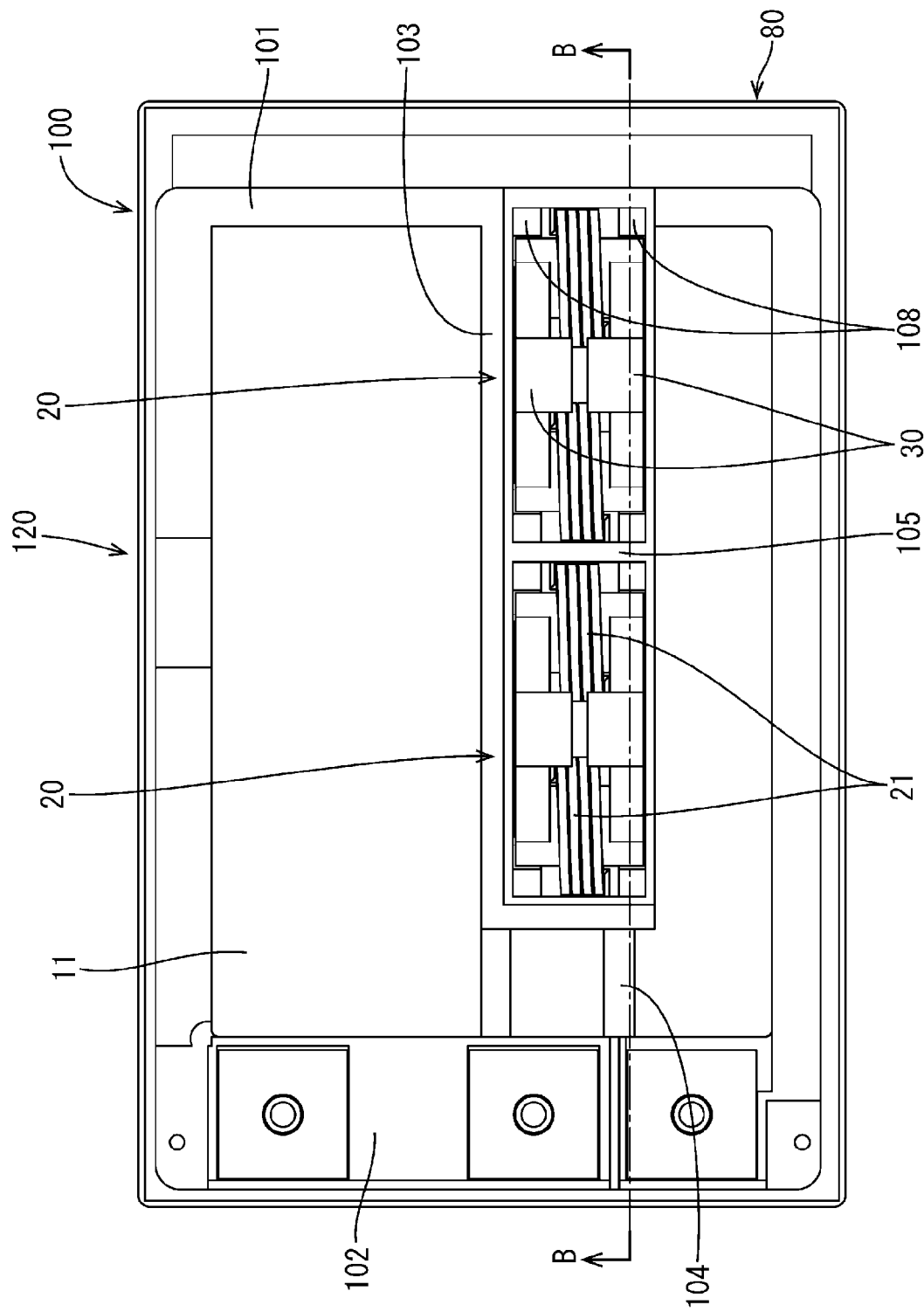
FIG. 13 is a plan view of a circuit assembly according to a second embodiment.

The frame 60 is made of synthetic resin, and has a substantially rectangular outer frame 61 as shown in FIGS. 10 and 12.

On one side of a pair of outer first side walls 61A extending in the short side direction of the outer frame 61, a terminal block 62 for positioning and accommodating a plate-like terminal for connection to an external terminal (not shown) protrudes inward. Also, the subframe 63 is provided integrally with the outer frame 61 at positions where the inductors 20 are disposed in the frame 60. In the present embodiment, two inductors 20 are provided side by side, and the subframe 63 has an elongated rectangular shape that surrounds the inductors 20 and fits the inductors 20 almost entirely inside.

One side (the right side in FIG. 10) of the pair of inner first side walls 63A extending in the short side direction of the subframe 63 is formed integrally with the outer frame 61. On the other hand, the inner first side wall 63A on the other side (the left side in FIG. 10) is provided with a pair of bridging portions 64 extending outward, and is formed integrally with the terminal block 62.

Inside the subframe 63, a partition wall 65 that divides the inner region into two is provided. A pair of regions surrounded by the partition wall 65 and the subframe 63 are a first accommodation portion 66A and a second accommodation portion 66B into which the two inductors 20 are fitted.

As shown in FIG. 5, the subframe 63 includes bottom walls 67 that continue to the lower end of the subframe 63. Near the pair of side edges, of bottom walls 67, extending in the longitudinal direction (near the side edges extending in the left-right direction in FIG. 11), core receiving portions 73 each having a shape extending along the side surface 31A of the bottom wall portion 31 of the magnetic core 30 are provided that rise from the bottom walls 67, when the inductors 20 are accommodated in the accommodation portions 66A and 66B.

Also, terminal through holes 72 for passing through the lead terminals 23 are provided at positions of the bottom walls 67 corresponding to the lead terminals 23, in the state where the inductors 20 are accommodated in the accommodation portions 66A and 66B. Each terminal through hole 72 has a tapered shape in which the hole edge on the upper end side expands outward.

Furthermore, rectangular frame side through holes 74 for passing through the receiving protrusions 42 provided on the heat sink 40 are provided at positions of the bottom walls 67 corresponding to the winding portions 22, in the state where the inductors 20 are accommodated in the accommodation portions 66A and 66B. Each frame side through hole 74 has a diameter that is slightly larger than that of the receiving protrusion 42 (see FIG. 5).

Figure 11:
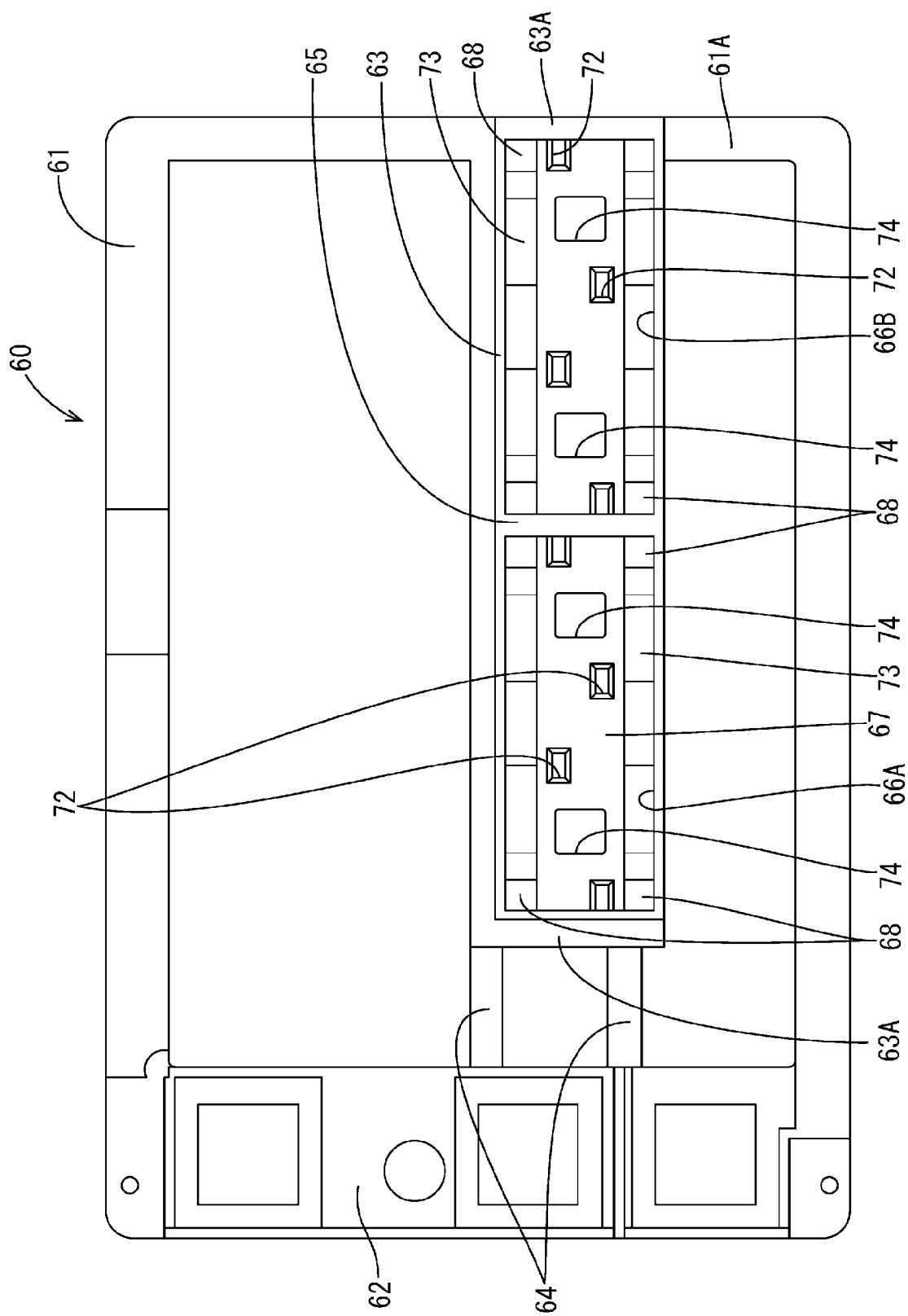
FIG. 11 is a plan view of the frame.

Also, at the four corners of the bottom wall 67 of each of the first accommodation portion 66A and the second accommodation portion 66B, overhanging portions 68 that overhang inward and extend in the vertical direction are provided (see FIG. 11). In the state where the inductors 20 are accommodated in the accommodation portions 66A and 66B, these overhanging portions 68 are in contact with the side surfaces of the magnetic cores 30 to reduce rattling of the inductors 20 in the accommodation portions 66A and 66B (see FIG. 2).

Figure 3:
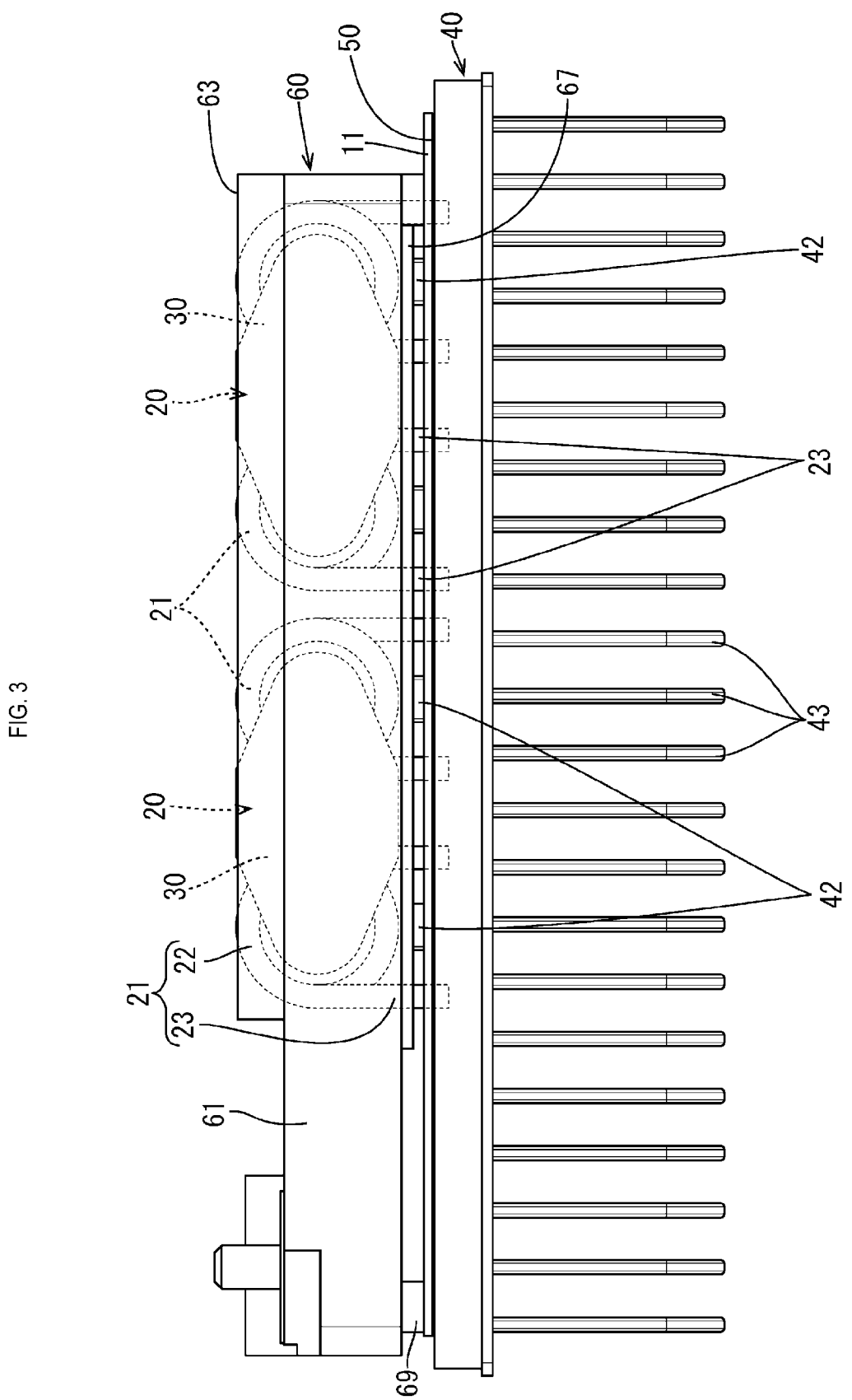
FIG. 3 is an elevation view of the circuit assembly.
Figure 4:
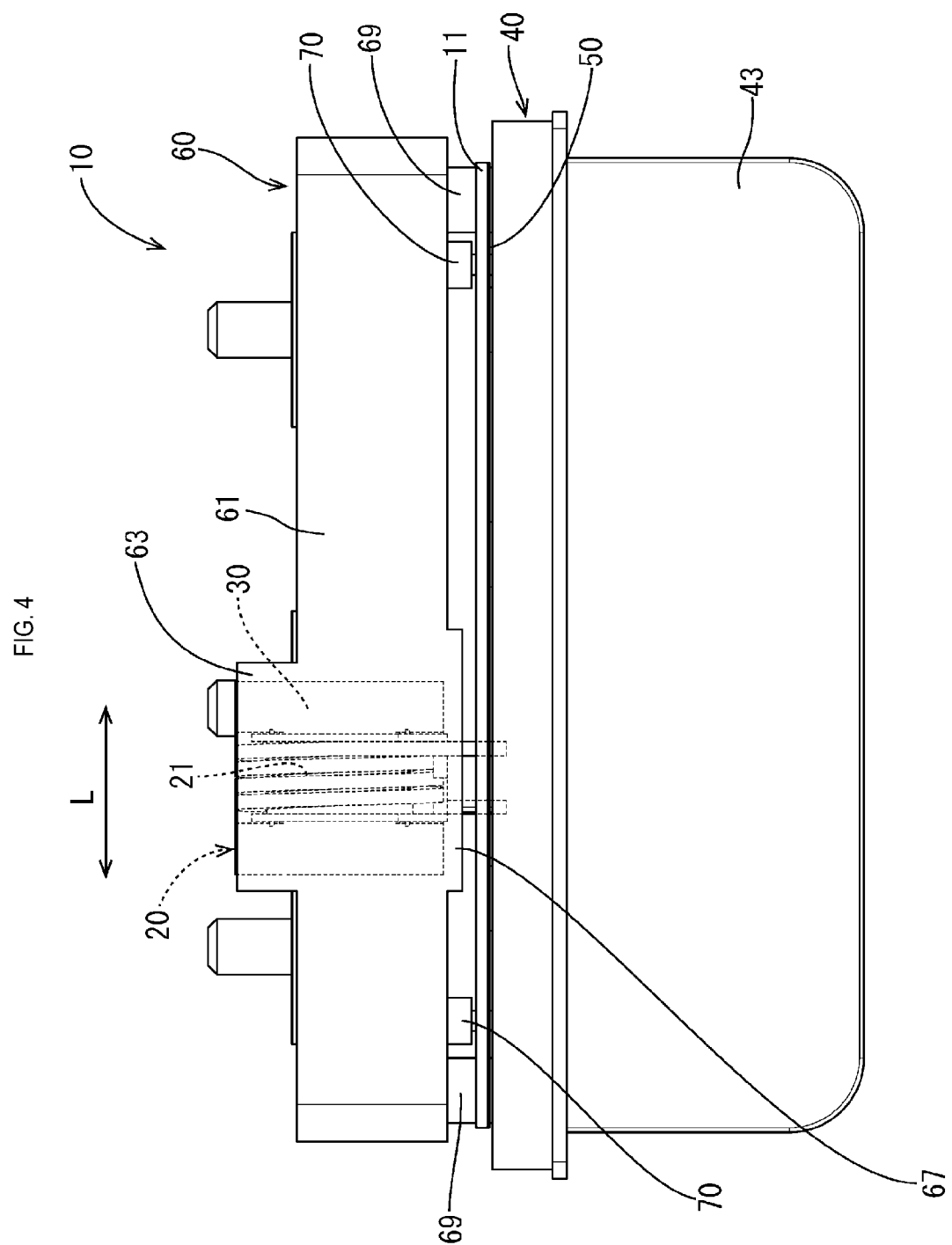
FIG. 4 is a right side view of the circuit assembly.

Note, that the subframe 63 has such a height that it can accommodate up to the top surface of the inductor 20, and is higher than the outer frame 61 and protrudes upward from the outer frame 61 (see FIGS. 3 and 4).

As shown in FIG. 12, legs 69 protruding downward are provided on the lower surface of the four corners of the outer frame 61. In addition, positioning projections 70 that protrude toward the heat sink 40 (downward) are provided next to the pair of legs 69 of the outer first side wall 61A on which the terminal block 62 is provided. These positioning projections 70 are fitted into positioning recesses 44 provided on the upper surface 40A of the heat sink 40, whereby the frame 60 is positioned with respect to the heat sink 40.

As shown in FIG. 5, in the assembled circuit assembly 10, the receiving protrusions 42 of the heat sink 40 penetrate the board side through holes 12 of the circuit board 11 and the frame side through holes 74 of the bottom walls 67 of the subframe 63 and protrude to the upper surface side of the bottom walls 67, and are in contact with the side surfaces 22A of the winding portions 22 of the coils 21 that are arranged such that the axes are along the circuit board 11.

Operation and Effect

The circuit assembly 10 of the present embodiment has the above configuration, and its operation and effect will be described next.

In the present embodiment, the board side through holes 12 are provided in the regions of the circuit board 11 corresponding to the coils 21 of the inductors 20. Also, in the regions of the heat sink 40 corresponding to board side through holes 12, the receiving protrusions 42 penetrate the board side through holes 12 and protrude to the surface side of the circuit board 11 on which the inductors 20 are disposed, and are in heat transfer contact with the winding portions 22 of the coils 21.

With this configuration, the receiving protrusions 42 provided on the heat sink 40 protrude from the through holes of the circuit board 11. Accordingly, the receiving protrusions 42 can be in heat transfer contact with the coils 21 at the positions close to the coils 21, which are heat generation members. As a result, the heat generated from the coils 21 and the magnetic cores 30 can be efficiently transferred to the heat sink 40, and can be dissipated to the outside.

Also, each coil 21 is disposed so that the axis of the winding portion 22 extends along the circuit board 11, and the receiving protrusion 42 is formed along the side surface 22A that extends along the axis of the winding portion 22, and is in contact with the side surface 22A of the winding portion 22.

In the configuration in which the coil 21 is arranged vertically with respect to the circuit board 11, the area required for the coil 21 on the circuit board 11 can be reduced, compared to a configuration in which the coil 21 is disposed in the direction in which the axis of the winding portion 22 intersects the circuit board 11. As a result, the circuit assembly 10 can be made more compact.

In addition, because the receiving protrusion 42 is shaped along the side surface 22 along the axis of the winding portion 22 of the coil 21 arranged vertically, even if the side surface 22A is not flat, the entire facing surface (the upper surface 42A) can be arranged close to the side surface 22A. Accordingly, the circuit assembly 10 is excellent in heat dissipation.

In the vertically arranged coil 21, if the side surface 22A of the winding portion 22 is not flat, there is a concern about rattling due to vibration, compared to the horizontally arranged coil. However, the receiving protrusion 42 that is shaped along the side surface 22A of the winding portion 22 can stably support at least a part of the winding portion 22 from the circuit board 11 side. Therefore, rattling of the coil 21 can be reduced.

As described above, according to the present embodiment, a circuit assembly 10 that has excellent heat dissipation can be obtained.

Second Embodiment

Next, the second embodiment will be described with reference to FIGS. 13 to 18. Hereinafter, only the structural aspects different from the first embodiment will be described. The circuit board 11 and the inductor 20 are denoted by the same reference numerals as those of the first embodiment. Also, for other compounds that are the same as those in the first embodiment, a reference numeral obtained by adding 40 to the reference numeral assigned to the corresponding compound in the first embodiment is used.

Figure 14:
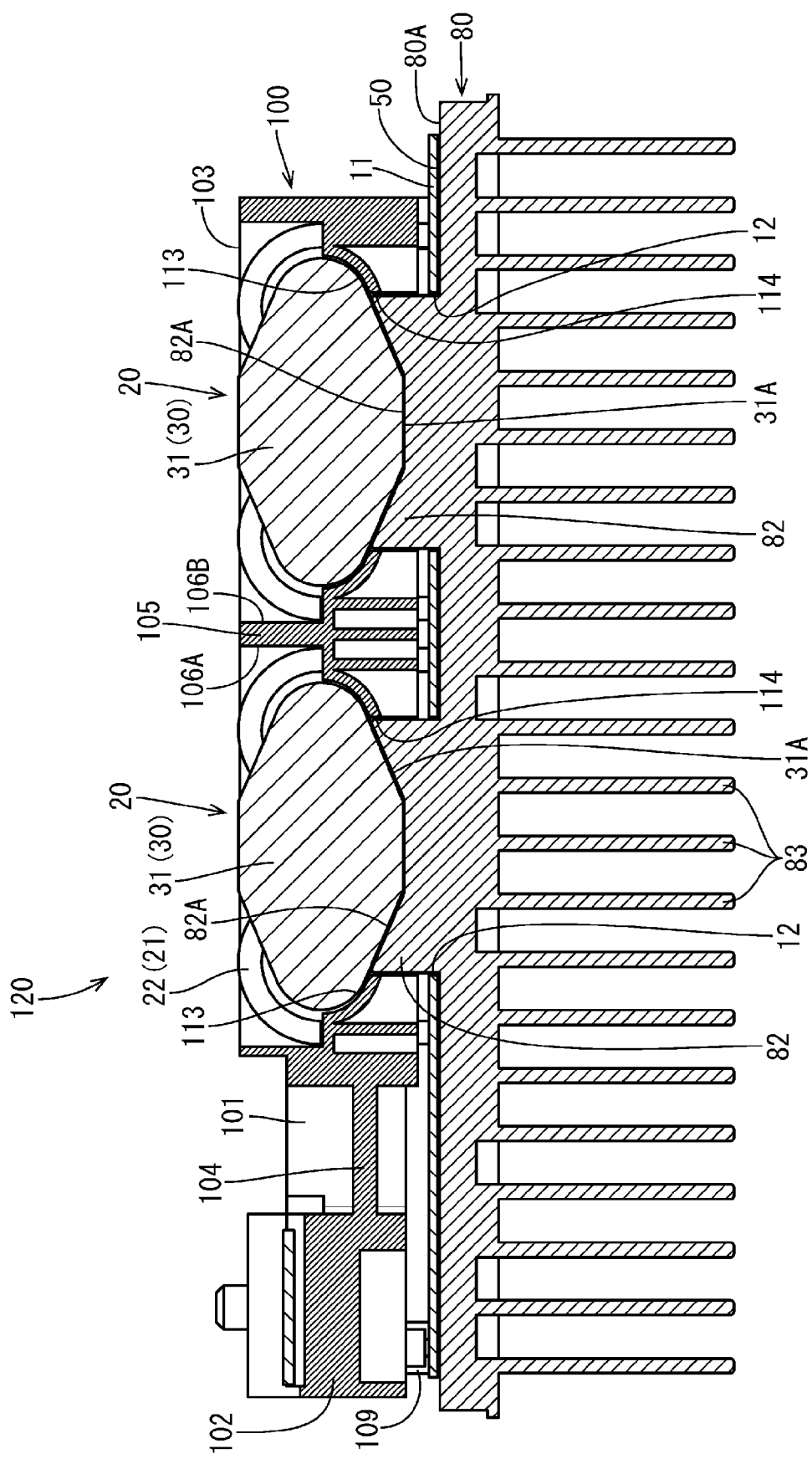
FIG. 14 is a cross sectional view taken along line B-B of FIG. 13.
Figure 15:
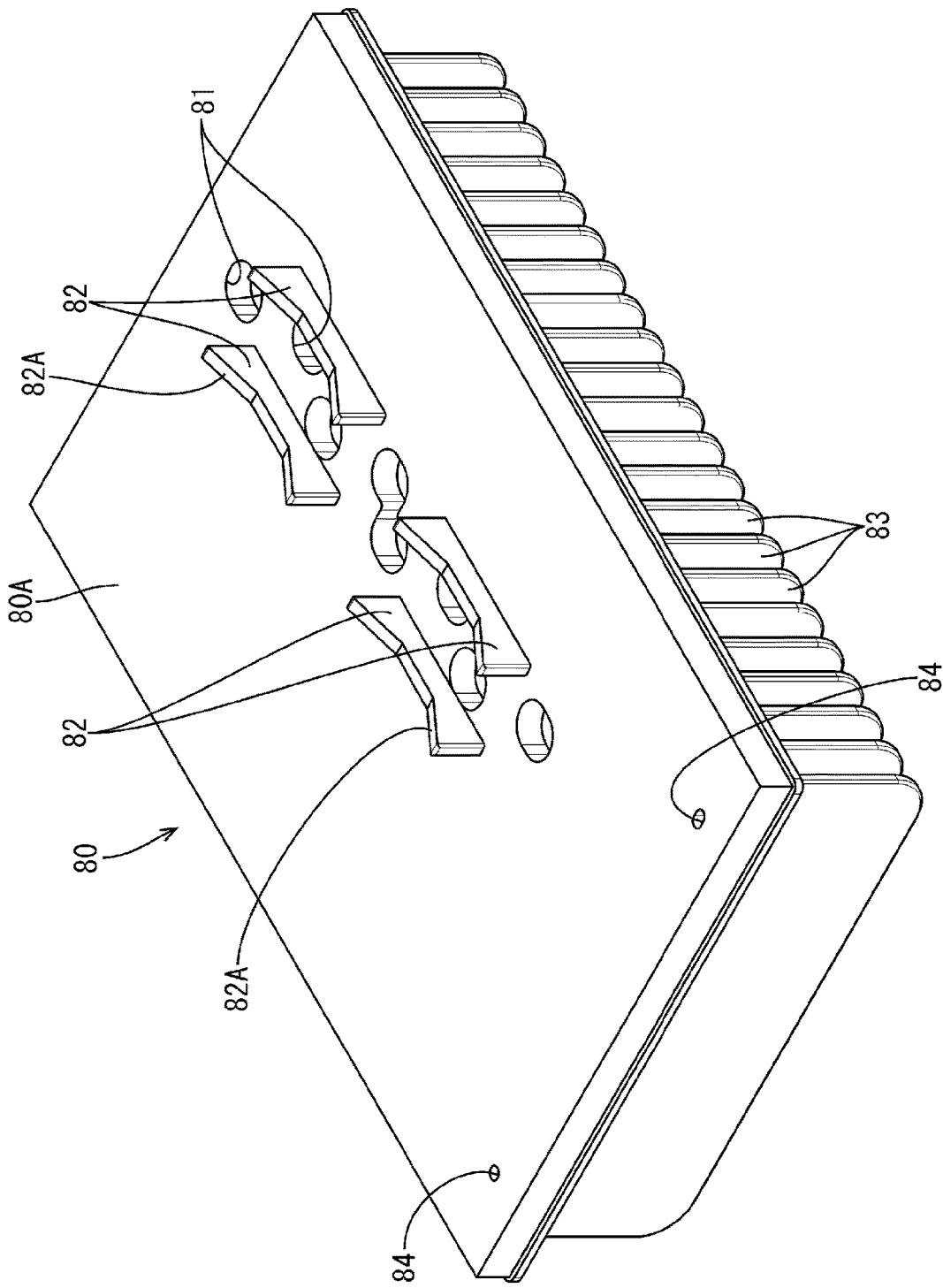
FIG. 15 is a perspective view of a heat sink.
Figure 16:
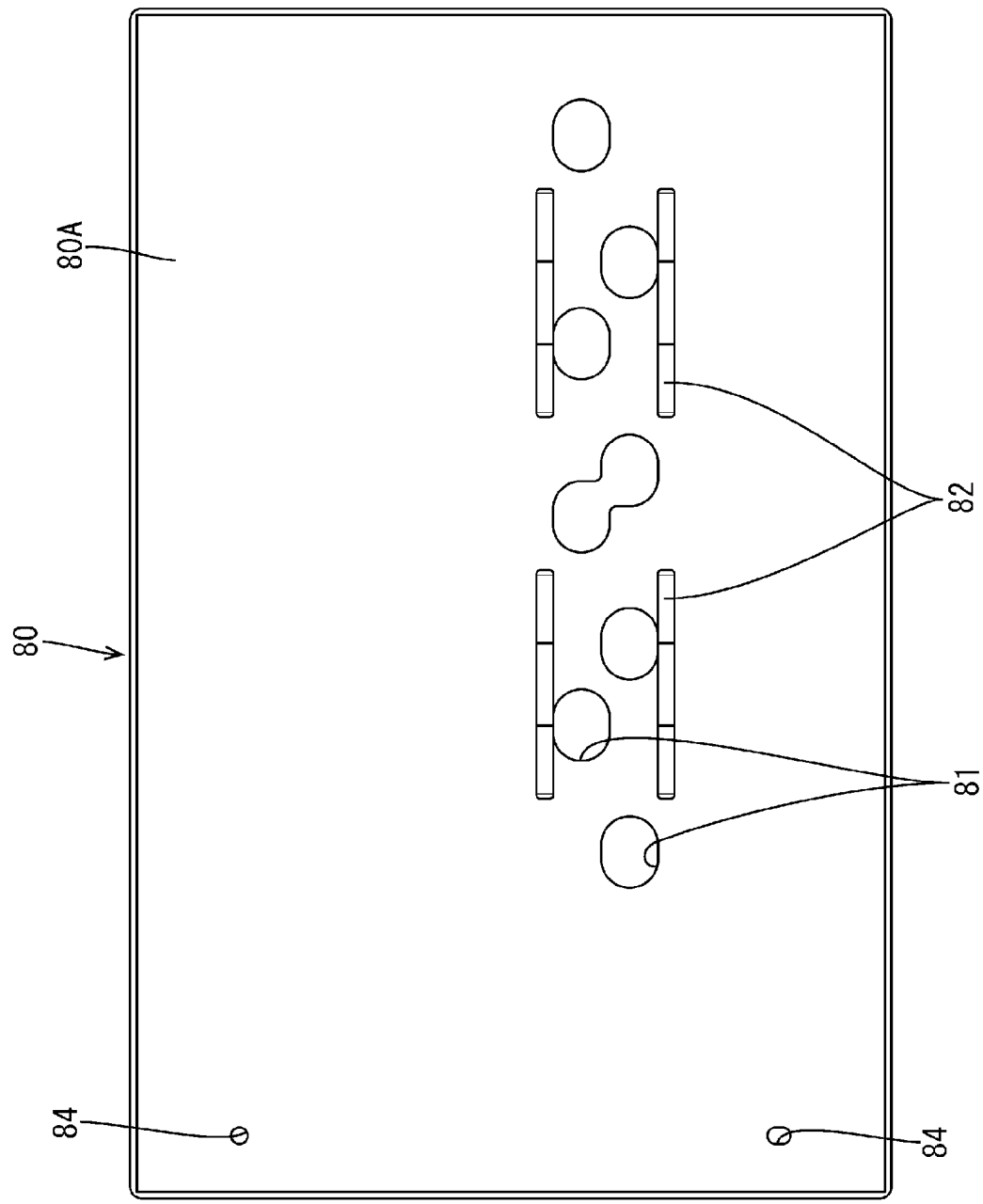
FIG. 16 is a plan view of the heat sink.
Figure 17:
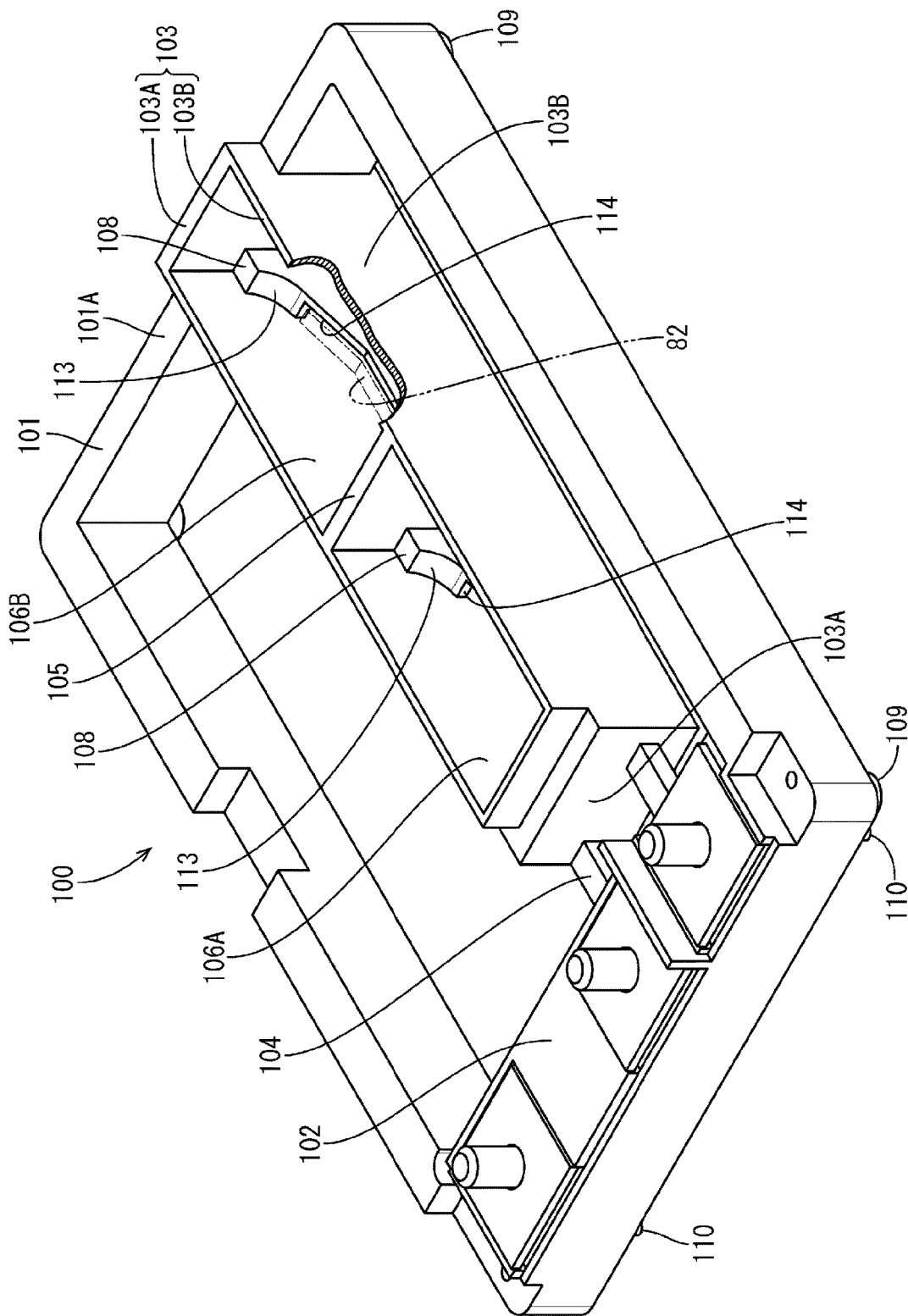
FIG. 17 is a partially cutaway perspective view of a frame.
Figure 18:
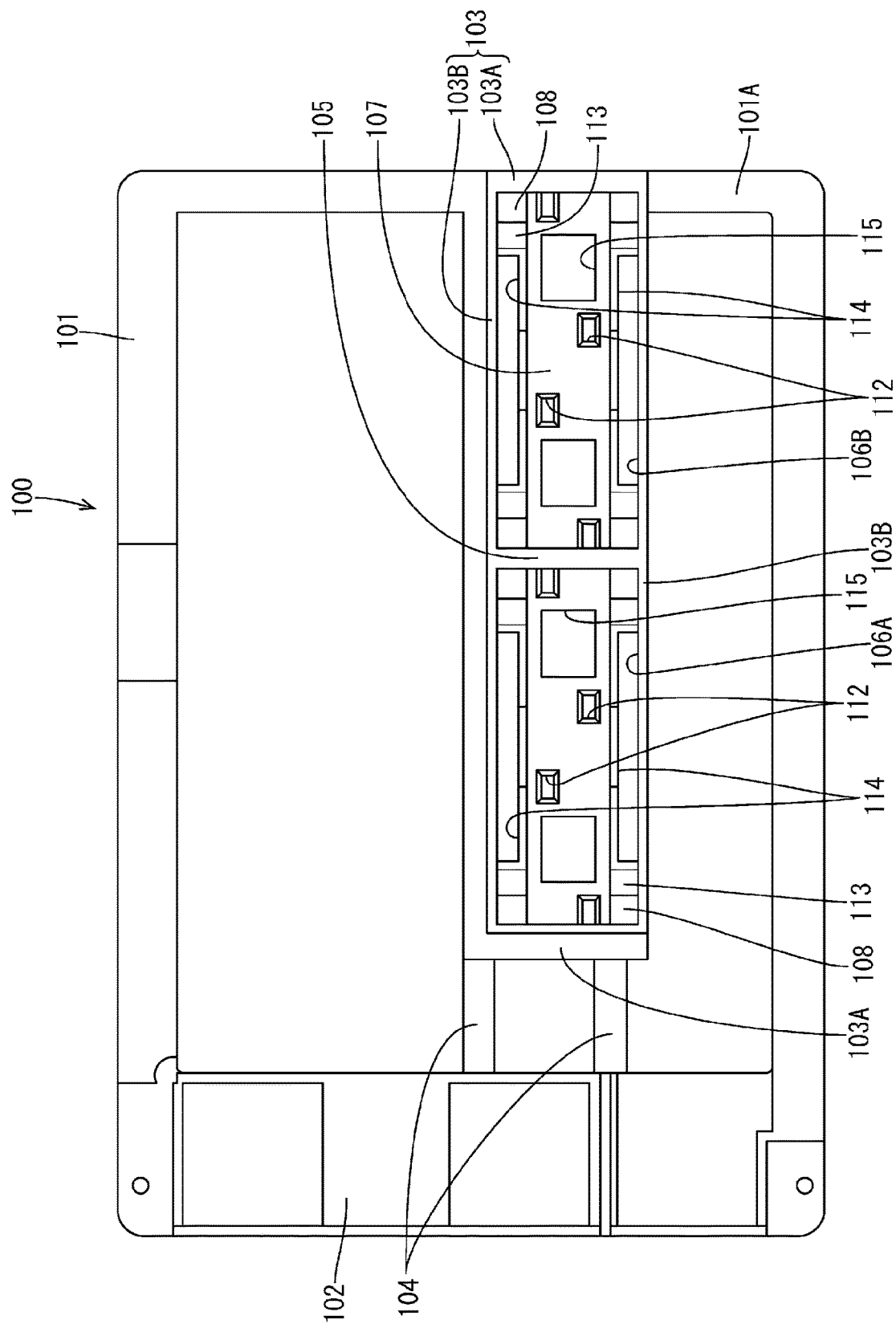
FIG. 18 is a plan view of the frame.

A circuit assembly 120 of the present embodiment is different from that of the first embodiment in the form of receiving protrusions 82 provided on a heat sink 80. As shown in FIGS. 15 and 16, in the regions where the pair of magnetic cores 30 (the first cores 30A and the second cores 30B) are disposed on the upper surface 80A of the heat sink 80, receiving protrusions 82 that protrude upward from the upper surface 80A and that are in heat transfer contact with the first core 30A and the second core 30B are provided (four in total). Each receiving protrusion 82 has a plate shape rising from the upper surface 80A of the heat sink 80, and its upper surface 82A (the surface facing the magnetic core 30) is cut out in a substantially trapezoidal shape and extends along a side surface 31A of a bottom wall portion 31 of the magnetic core 30, as shown in FIG. 14.

The protruding dimension of the receiving protrusion 82 from the upper surface 80A of the heat sink 80 is set to be larger than the thickness of the circuit board 11. With this configuration, in the state where the circuit board 11 is disposed at the predetermined position of the upper surface 80A of the heat sink 80, the receiving protrusions 82 penetrate the board side through holes 12 of the circuit board 11 and protrude upward from the upper surface of the circuit board 11, approaching the winding portions of the pair of magnetic cores 30.

In the state where a frame 100 described later is positioned with respect to the circuit board 11, the protruding dimension of the receiving protrusion 82 is set to such a dimension that it penetrates a bottom wall 107 of a subframe 103 described later and protrudes upward from the bottom wall 107, and that it can contact a side surface 31A of a bottom wall portion 31 of the magnetic core 30.

Frame 100

The frame 100 of the present embodiment is different from that of the first embodiment in the form of the subframe 103.

In the present embodiment, of core receiving portions 113 provided on the bottom walls 107 of the subframe 103, in a region near the pair of inner second walls 103B extending in the longitudinal direction of the subframe 103, frame side through holes 114 are provided for disposing the above receiving protrusions 82 in a first accommodation portion 106A and a second accommodation portion 106B. The frame side through holes 114 are for disposing the receiving protrusions 82 provided on the heat sink 80 in the first accommodation portion 106A and the second accommodation portion 106B, and each have a diameter through which the receiving protrusion 82 is inserted (see FIG. 17).

Also, in the present embodiment, heat dissipation through holes 115 are provided at positions corresponding to the winding portions 22, in the state where the inductors 20 are accommodated in the accommodation portions 106A and 106B in the bottom walls 107. Furthermore, in the circuit board 11, areas corresponding to the heat dissipation through holes 115 of the frame 100 are provided with board side heat dissipation through holes (not shown).

As shown in FIG. 14, in the assembled circuit assembly 120, the upper surfaces 82A of the receiving protrusions 82 of the heat sink 80 are disposed in the accommodation portions 106A and 106B through the board side through holes 12 of the circuit board 11 and the frame side through holes 114 provided on the core receiving portions 113 of the subframe 103. As a result, the receiving protrusions 82 are in contact with the side surfaces 31A of the bottom wall portions 31 of the magnetic cores 30.

In this state, the upper surfaces of the core receiving portions 113 of the frame 100 and the upper surfaces 82A of the receiving protrusions 82 of the heat sink 80 are flush with each other, and the core receiving portions 113 and the receiving protrusions 82 support the magnetic cores 30 (see FIG. 14).

In the circuit assembly 120 according to the present embodiment, the board side through holes 12 are provided in regions of the circuit board 11 corresponding to the magnetic cores 30 of the inductors 20. Also, in regions of the heat sink 80 corresponding to the board side through holes 12, receiving protrusions 82 are provided, which penetrate the board side through holes 12, protrude the surface side of the circuit board 11 on which the inductors 20 are disposed, and are in heat transfer contact with the side surfaces 31A of the bottom wall portions 31 of the magnetic cores 30.

Accordingly, the receiving protrusions 82 provided in the heat sink 80 protrude from the circuit board 11, and can be in heat transfer contact with the magnetic cores 30, which are the heat generation members, at positions close to the magnetic cores 30. As a result, the heat generated from the coils 21 and the magnetic cores 30 can be efficiently transferred to the heat sink 80, and can be dissipated to the outside.

Other Embodiments

The technique disclosed in the present specification is not limited to the embodiments described with reference to the above description and the drawings, and for example, the following embodiments are also included in the technical scope.

In the above embodiments, the receiving protrusions 42 or 82 protruding through the circuit board 11 are in contact with the winding portions 22 or the bottom wall portions 31. However, a configuration may also be employed in which both the receiving protrusions 42 and 82 are provided on the heat dissipation plate to contact both the winding portions 22 and the magnetic cores 30.

In the above embodiments, the upper surface 42A (82A) (the facing surface) of the receiving protrusion 42 (82) extends along the side surface 22A of the winding portion 22 (the side surface 31A of the bottom wall portion 31). However, the upper surface 42A (82A) of the receiving protrusion 42 (82) does not necessarily have to extend along the side surface 22A of the winding portion 22 (the side surface 31A of the bottom wall portion 31). It is sufficient that the upper surface 42A (82A) of the receiving protrusion 42 (82) is in heat transfer contact with the side surface 22A of the winding portion 22 (the side surface 31A of the bottom wall portion 31).

In the above embodiments, a filler such as grease or a heat dissipation agent may also be provided between the receiving protrusions 42 (82) and the winding portions 22 (the bottom wall portions 31). Alternatively, a cushioning material such as a heat dissipation sheet may also be provided. With this configuration, even if there is a gap due to tolerance between the winding portion 22 (the bottom wall portion 31) of the coil 21 and the upper surface 42A (82A) of the receiving protrusion 42 (82), both of them can be reliably brought into heat transfer contact. As a result, a circuit assembly having an even better heat dissipation effect can be obtained.

In the above embodiments, an adhesive agent may also be provided between the receiving protrusions 42 (82) and the winding portions 22 (the bottom wall portions 31). With this configuration, even if there is a gap due to tolerance between the winding portion 22 (the bottom wall portion 31) of the coil 21 and the upper surface 42A (82A) of the receiving protrusion 42 (82), both of them can be reliably brought into heat transfer contact, and can be mechanically fixed. As a result, a circuit assembly that is more excellent in heat dissipation effect, impact resistance, and vibration resistance can be obtained.

The bottom walls 67 and 107 that are provided on the subframes 63 and 103 may also be omitted.

The receiving protrusions 42 and 82 are configured to be in heat transfer contact with the coils 21 of the magnetic cores 30 of the inductors 20. However, the receiving protrusions can be used for receiving components that are accommodated in an insulating case. The receiving protrusions can be used for receiving choke coils accommodated in the case, for example.

The invention claimed is:

1. A circuit assembly comprising:
a circuit board;
an inductor that is disposed on the circuit board, and that includes a coil including a winding portion made by winding a winding wire, and a core member;
a heat dissipation plate that overlaps the opposite side of the surface of the circuit board on which the inductor is disposed; and
an insulating frame that is positioned with respect to the circuit board,
wherein the frame integrally includes a subframe that includes side walls that surround at least a part of the inductor, and a bottom wall that continues to the side walls, and that is disposed between the inductor and the circuit board in a state separated from the circuit board,
a board side through hole is provided in a region of the circuit board that corresponds to the inductor, and a frame side through hole is provided in a region of the bottom wall that corresponds to the board side through hole, and
a receiving protrusion that penetrates the board side through hole and the frame side through hole, that protrudes to a surface side of the circuit board on which the inductor is disposed, and that is in heat transfer contact with the coil or the core member is provided in a region of the heat dissipation plate that corresponds to the board side through hole.

2. The circuit assembly according to claim 1, wherein the coil is disposed so that the axis of the winding portion extends along the circuit board, and the receiving protrusion has a shape extending along a side surface that extends along the axis of the winding portion, and is in heat transfer contact with the side surface.

3. The circuit assembly according to claim 1, wherein a filler is provided between the receiving protrusion and the coil or the core member.

4. The circuit assembly according to claim 1, wherein a cushioning material is provided between the receiving protrusion and the coil or the core member.

5. The circuit assembly according to claim 2, wherein a filler is provided between the receiving protrusion and the coil or the core member.

6. The circuit assembly according to claim 2, wherein a cushioning material is provided between the receiving protrusion and the coil or the core member.

* * * * *